United States Patent
Zenkyu

(10) Patent No.: US 11,153,130 B2
(45) Date of Patent: Oct. 19, 2021

(54) EQUALIZER, RECEIVING APPARATUS AND RECEIVING METHOD

(71) Applicant: NEC CORPORATION, Tokyo (JP)

(72) Inventor: Ryuji Zenkyu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/619,305

(22) PCT Filed: Jun. 5, 2018

(86) PCT No.: PCT/JP2018/021491
§ 371 (c)(1),
(2) Date: Dec. 4, 2019

(87) PCT Pub. No.: WO2018/225708
PCT Pub. Date: Dec. 13, 2018

(65) Prior Publication Data
US 2020/0162291 A1  May 21, 2020

(30) Foreign Application Priority Data

Jun. 6, 2017 (JP) .............................. JP2017-111463

(51) Int. Cl.
*H04L 25/03* (2006.01)
*H04B 17/336* (2015.01)
(Continued)

(52) U.S. Cl.
CPC ....... *H04L 25/03057* (2013.01); *H04B 7/005* (2013.01); *H04B 7/0854* (2013.01);
(Continued)

(58) Field of Classification Search
CPC ..... H04L 25/03057; H04L 2025/03617; H04L 25/03891; H04L 25/03949;
(Continued)

(56) References Cited

U.S. PATENT DOCUMENTS 7,894,516 B2 * 2/2011 Liang ................ H04L 25/03057
375/232
8,325,862 B2  12/2012 Kusano
(Continued)

FOREIGN PATENT DOCUMENTS

JP  2003-229794 A  8/2003
JP  2003-338779 A  11/2003
(Continued)

OTHER PUBLICATIONS

N. Souto and R. Dinis, "MIMO Detection and Equalization for Single-Carrier Systems Using the Alternating Direction Method of Multipliers," in IEEE Signal Processing Letters, vol. 23, No. 12, pp. 1751-1755, Dec. 2016, doi: 10.1109/LSP.2016.2618959. (Year: 2016).*

(Continued)

*Primary Examiner* — Sam K Ahn
*Assistant Examiner* — Amneet Singh
(74) *Attorney, Agent, or Firm* — Sughrue Mion, PLLC

(57) ABSTRACT

An equalizer can connect with N receiving antennas that receive single carrier transmission signals transmitted from M transmitting antenna(s) in the same frequency band at the same time, and receives as input L signals sampled in a sampling period T from each of the N receiving antennas, the equalizer comprising, a first selection part that selects K signal(s) from the L signals for each of the N receiving antennas as signals to be multiplied by a first tap coefficient(s), and a second selection part selects L-K signal(s) to be multiplied by a second tap coefficient(s), from the L signals obtained by multiplying signals in the same sampling period for each of the N receiving antennas by the tap coefficient(s) and performing addition thereof.

11 Claims, 10 Drawing Sheets

(51) Int. Cl.
*H04B 7/005* (2006.01)
*H04B 7/08* (2006.01)
*H04B 7/0413* (2017.01)

(52) U.S. Cl.
CPC ......... *H04B 7/0857* (2013.01); *H04B 17/336* (2015.01); *H04B 7/0413* (2013.01); *H04L 2025/03617* (2013.01)

(58) Field of Classification Search
CPC ........... H04L 2025/03426; H04L 2025/03726; H04B 17/336; H04B 7/005; H04B 7/0854; H04B 7/0857; H04B 7/0413; H04B 7/0845; H03H 17/00; H03H 21/00
See application file for complete search history.

(56) References Cited

U.S. PATENT DOCUMENTS

2009/0262853 A1* 10/2009 Yoshida ............... H04B 1/7107
375/267
2010/0322362 A1 12/2010 Kusano
2015/0244546 A1* 8/2015 Shirakawa ........ H04L 25/03968
375/229

FOREIGN PATENT DOCUMENTS

| JP | 2006-101003 A | 4/2006 |
| JP | 2009-105622 A | 5/2009 |
| JP | 2009-135866 A | 6/2009 |
| JP | 2011-139294 A | 7/2011 |
| JP | 2013-031050 A | 2/2013 |
| WO | 2008/129811 A1 | 10/2008 |

OTHER PUBLICATIONS

Tryggvi Ingason et al., "Line-of-Sight MIMO for Microwave Links Adaptive Dual Polarized and Spatially Separated Systems", Master of Thesis in Communication Engineering, Chalmers University of Technology, Jul. 2009, 117 pages.

Ryuji Kohno, "Spatial and Temporal Communication Theory Using Adaptive Antenna Array", IEEE Personal Communications, Feb. 1998, pp. 28-35.

International Search Report for PCT/JP2018/021491, dated Aug. 28, 2018.

* cited by examiner

FIG. 10

| CONFIGURATION CHANGE | CONTROL SIGNAL EXAMPLE |
|---|---|
| FIG. 9 CONFIGURATION => FIG. 6 CONFIGURATION | 100 |
| FIG. 9 CONFIGURATION => FIG. 7 CONFIGURATION | 010 |
| FIG. 9 CONFIGURATION => FIG. 8 CONFIGURATION | 001 |

EQUALIZER, RECEIVING APPARATUS AND RECEIVING METHOD

CROSS-REFERENCE TO RELATED APPLICATIONS

This application is a National Stage of Application No. PCT/JP2018/021491 filed Jun. 5, 2018, claiming priority based on Japanese Patent Application No. 2017-111463 (filed on Jun. 6, 2017) the content of which is hereby incorporated in its entirety by reference into this specification. The present invention relates to an equalizer, a receiving apparatus and a receiving method.

FIELD

In particular the invention relates to an equalizer, a receiving apparatus and a receiving method that handle Multiple Input and Multiple Output (MIMO) performing demodulation processing by an adaptive equalization algorithm, for received signals received by N antennas (N is an integer greater than or equal to 2), with regard to transmission signals of a single carrier (SC) transmitted from M antennas (M is an integer greater than or equal to 2) in the same frequency band at the same time.

BACKGROUND

Along with the popularization of smartphones and IoT (Internet of Things) devices, there is a steady increase in communication traffic. The increase in communication traffic is expected to continue henceforth, and there is a demand for large capacity, high speed transmission including communication between a terminal(s) and a base station(s).

From the above background, research and development of next generation mobile communication systems (5G) are being carried out in various countries throughout the world. One target of the next generation mobile communication systems (5G) is to alleviate communication traffic congestion in crowded areas, and consideration is being given to deploying base stations at intervals of tens of meters. If large capacity, high speed transmission of communication between terminals and base stations is to be performed by next generation mobile communication systems (5G), increased capacity is necessary for Fronthaul/Backhaul (FH/BH), which relates to communication between the base stations supporting the large capacity, high speed transmission.

Wired FH/BH that uses existing optic fiber is suitable for large capacity, high speed transmission, but there is a problem in that flexibility of deployment is low. Therefore, in a case where it is not possible to construct an adequate number of wired FH/BH in an area where there is communication traffic congestion, there is a demand for combined use of wireless FH/BH with a high degree of flexibility in deployment.

Meanwhile, for wireless FH/BH there is a problem regarding large capacity, high speed transmission.

In wireless FH/BH, SC-Single Input and Single Output (SC-SISO) transmission is used, and increased capacity is advanced by ultra-multi-level modulation and wider bandwidth. However, improvement in performance using these technologies is reaching limits, and achieving dramatically larger capacity that is required by next generation mobile communication systems (5G) will be difficult.

Therefore, in next generation wireless FH/BH, the introduction of multiplexing technology is being investigated, and investigation has begun into SC-Multiple Input and Multiple Output (MIMO) transmission, in which conventional SC-SISO transmission is expanded.

Here, one problem in SC-MIMO transmission is that reception quality deteriorates due to the mixing of Co-channel Interference (CCI) and Intersymbol Interference (ISI). Therefore, in order to compensate for deterioration in reception quality, it is necessary that a receiver be provided with an equalizer.

For example, with a time domain linear equalizer according to a minimum mean square error (MMSE) rule, an original transmission signal is estimated by adding signals obtained by multiplying a sampled signal, which is an input signal from a receiving antenna, by a tap coefficient(s). The tap coefficients are determined so as to minimize square error between the transmission signal and the abovementioned estimated signal. At this occasion, since the implementation cost of the linear equalizer is dependent on the number of multipliers, as a result it is dependent on the number of the tap coefficients.

Meanwhile, as the number of the tap coefficients becomes larger, there is a tendency for the equalizer performance to improve. Therefore, with the equalizer used in SC-MIMO transmission, it may be said that there is a tradeoff between implementation cost and reception quality depending on the number of the tap coefficients.

There are several methods of determining the tap coefficients, but here successive updating by an adaptive equalization algorithm is used, so as to enable the equalizer to follow time change with regard to a communication channel and a transceiver.

In SC-MIMO transmission, time domain linear equalizers that use an adaptive equalization algorithm are roughly classified in 2 types: one that uses technology disclosed in Non-Patent Literature (NPL) 1 (denoted below as first equalization technology), and one that uses technology disclosed in Non-Patent Literature 2 (denoted below as second equalization technology).

[NPL1] T. Ingason and H. Liu, "Line-of-Sight MIMO For Microwave Links Adaptive Dual Polarized and Spatially Separated Systems," Master's thesis, Chalmers University of Technology, 2009.

[NPL2] R. Kohno, "Spatial and Temporal Communication Theory Using Adaptive Antenna Array," IEEE Personal Communications, pp. 28-35, February 1998.

SUMMARY

A description is given below wherein an input signal to an equalizer according to the above mentioned first and second equalization technologies is a reception signal sampled in a sampling period T. The number of sampled signals inputted to the equalizer is L (L is an integer greater than or equal to 1).

In the first equalization technology, in a case where L signals from N receiving antennas are respective input signals, a transmission signal is estimated by multiplying respective input signals by tap coefficients and performing addition thereof. Therefore, in the first equalization technology the number of tap coefficients must be N×L.

On the other hand, the second equalization technology has an equalizer in accordance with an assumption of independent compensation of each of CCI and ISI (denoted below as an assumption of independent compensation). That is, the equalizer according to the second equalization technology is an equalizer with a configuration that performs CCI compensation in a first stage, and performs ISI compensation in a later stage. In more detail, in the second equalization technology, one signal is generated by multiplying respective inputted signals from N receiving antennas by tap coefficients and performing addition thereof, in the first stage. Thereafter, in the later stage, the transmission signal is estimated by multiplying the abovementioned generated signals (L signals) by the tap coefficients, and performing addition thereof. Accordingly, in the second equalization technology the number of tap coefficients must be N+L.

Normally, since L is larger than N, it may be said that the implementation cost of an equalizer in the second equalization technology is lower than an equalizer according to the first equalization technology. On the other hand, since there is an assumption of independent compensation, the reception quality in a case of using the second equalization technology may be said to also be lower than reception quality in a case of using the first equalization technology.

In addition, in a case where an equalizer is realized by a hardware (HW) implementation or a software (SW) implementation, when the number of receiving antennas increases, the difference in implementation costs between the first and the second equalization technologies becomes large. More specifically, when the number of receiving antennas becomes greater than or equal to a certain fixed number, the implementation costs according to the first equalization technology exceed HW or SW implementable resources, and the equalizer according to the second equalization technology remains as an implementable selection option.

In a case of implementing the equalizer according to the second equalization technology, since the implementation cost is lower than for the equalizer according to the first equalization technology, a case is assumed in which there are surplus HW or SW resources. In the second equalization technology, since the reception quality is low according to the assumption of independent compensation, an improvement in the reception quality is anticipated by assigning more resources allowed for HW or SW implementation.

It is an object of the present invention to provide an equalizer, a receiving apparatus and a receiving method that contribute towards realizing a balance between implementation cost and reception quality.

According to a first aspect of the present invention, an equalizer is provided that can connect with N receiving antennas (N is an integer greater than or equal to 2) that receive single carrier transmission signals transmitted from M transmitting antennas (M is an integer greater than or equal to 2) in the same frequency band at the same time, and that receive as input L signal(s) (L is an integer greater than or equal to 1) sampled according to a sampling period T from each of the N receiving antennas, the equalizer comprising:

a first selection part that selects K signal(s) (K is an integer greater than or equal to 1 and smaller than L) from the L signals, as signals to be multiplied by a first tap coefficient(s), for each of the N receiving antennas;

and a second selection part that selects L-K signal(s) to be multiplied by a second tap coefficient(s), from the L signals obtained by multiplying signals in the same sampling period for each of the N receiving antennas, by the second tap coefficients and performing addition thereof.

According to a second aspect of the invention, a receiving apparatus including the abovementioned equalizer is provided.

According to a third aspect of the invention, a receiving method is provided in an equalizer that can connect with N receiving antennas (N is an integer greater than or equal to 2) that receive single carrier transmission signals transmitted from M transmitting antennas (M is an integer greater than or equal to 2) in the same frequency band at the same time, and that receive as input L signal(s) (L is an integer greater than or equal to 1) sampled according to a sampling period T from each of the N receiving antennas, the method comprising: selecting K signal(s) (K is an integer greater than or equal to 1 and smaller than L) from among the L signal(s), as signal(s) to be multiplied by a first tap coefficient(s), for each of the N receiving antennas; and selecting L-K signal(s) to be multiplied by a second tap coefficient(s), from among the L signals obtained by multiplying signals in the same sampling period for each of the N receiving antennas, by the second tap coefficient(s) and performing addition thereof.

According to each aspect of the present invention there are provided: an equalizer, a receiving apparatus and a receiving method, that contribute to realizing a balance between reception quality and implementation cost.

BRIEF DESCRIPTION OF DRAWINGS

FIG. 10 is a diagram showing an example of a control signal for changing to the configuration of the equalizer shown in FIG. 6 to FIG. 9.

PREFERRED MODES

Figure 1:
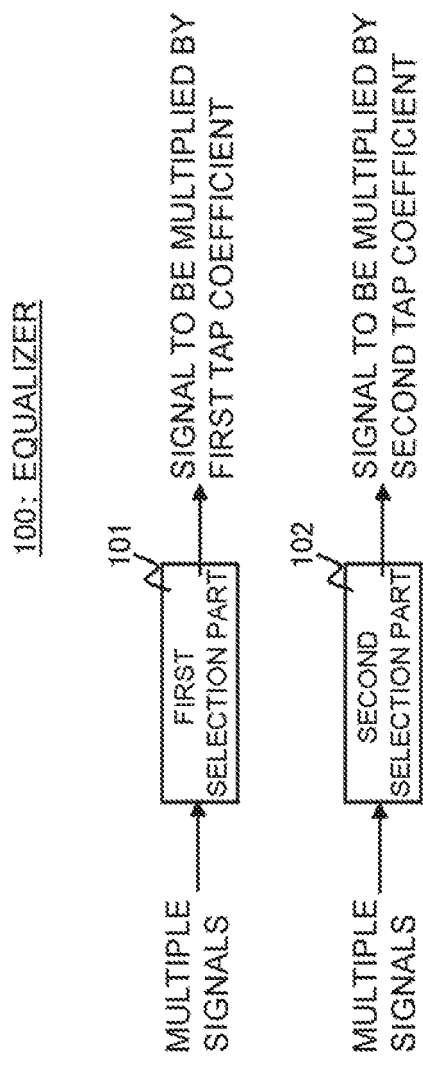
FIG. 1 is a diagram for illustrating an outline of an exemplary embodiment.

First, a description is given concerning an outline of an exemplary embodiment. It is to be noted that reference symbols in the drawings attached to this outline are added to respective elements for convenience, as examples in order to aid understanding, and the outline description is not intended to limit the invention in any way. Connection lines between blocks in respective diagrams may be bidirectional or unidirectional. Unidirectional arrows schematically show flow of main signals (data), but do not exclude bidirectionality. In addition, although not explicitly disclosed, in the circuit diagrams, block diagrams, internal configuration diagrams, connection diagrams and the like, shown in the disclosure of the present application, input ports and output ports are present at respective input terminals and output terminals of each connection line. The same applies for input output interfaces.

The equalizer 100 according to an exemplary embodiment can connect with N receiving antennas (N is an integer greater than or equal to 2) that receive single carrier transmission signals transmitted from M transmitting antennas (M is an integer greater than or equal to 2), in the same frequency band at the same time. The equalizer 100 receives as input L signal(s) (L is an integer greater than or equal to 1) sampled in a sampling period T, from each of the N receiving antennas. The equalizer 100 is provided with a first selection part 101 and a second selection part 102 (refer to FIG. 1). The first selection part 101 selects K signal(s) (K is an integer greater than or equal to 1 and less than L) from the L signals as signals to be multiplied by a first tap coefficient(s), for each of the N receiving antennas. The second selection part 102 selects L-K signal(s) to be multiplied by a second tap coefficient(s), from the L signals obtained by multiplying signals in the same sampling period for each of the N receiving antennas by the tap coefficient and performing addition thereof.

Here the description of a configuration and operation related to the abovementioned equalizer 100 is considered with an assumption of independent compensation as described above.

If the assumption of independent compensation is applied to the tap coefficients of an equalizer in the first equalization technology, the tap coefficient(s) is(are) derived that assumes that CCI and ISI are independently compensated, as in the tap coefficient(s) of the equalizer according to the second equalization technology. On this occasion, if consideration is given to applying the assumption of independent compensation not to all tap coefficients of the equalizer according to the first equalization technology, but to a portion thereof, with regard to a tradeoff between reception quality and implementation cost, an equalizer that is intermediate between the first and second equalization technologies can be configured. That is, the implementation cost of the equalizer which is intermediate between the first and second equalization technologies is determined by the number of the tap coefficients where the assumption of independent compensation is applied. Meanwhile, the reception quality of the equalizer which is intermediate between the first and second equalization technologies is determined according to a combination of tap coefficients where the assumption of independent compensation is applied, and to a communication channel state or the like. Therefore, it is desirable to have an equalizer for which a combination of tap coefficients, with an assumption of independent compensation, can be changed as appropriate, in response to a communication channel state.

From the abovementioned point of view, the equalizer 100 is configured to be intermediate between the first and second equalization technologies. More specifically, the signals selected by the first selection part 101 are calculated by multiplication by the tap coefficient(s) according to the first equalization technology. The signals selected by the second selection part 102 are calculated by multiplication by the tap coefficient(s) according to the second equalization technology. In this way, the equalizer 100 curtails implementation cost increase by introducing the excellent second equalization technology to implementation cost. In the equalizer 100, since the configuration is such that the signal(s) to be multiplied by the tap coefficient(s) can be selected by the first selection part 101 or the second selection part 102, it is possible to maintain good reception quality by switching signals selected in accordance with the communication channel state, for example.

As described above, the disclosure of the present application relates to the equalizer that is intermediate between the first and second equalization technologies, and it is possible to provide the equalizer 100 that has good reception quality, by selecting the signals in accordance with the communication channel state, for example. That is, in SC-MIMO transmission, the equalizer 100 is partially provided with the equalizer according to the first and the second equalization technologies, and performs optimization in accordance with the communication channel state, by changing assignment of the signals inputted thereto, by the two selection parts. That is, the equalizer 100 optimizes the performance of a time domain linear equalizer that compensates CCI and ISI, in accordance with the communication channel state.

Detailed description is given concerning specific exemplary embodiments below, making reference to the drawings. It is to be noted that in each of the exemplary embodiments, the same symbols are attached to the same configuration elements and descriptions thereof are omitted.

<First Exemplary Embodiment>

More detailed description is given concerning a first exemplary embodiment, using the drawings.

In the first exemplary embodiment, description is given centered on a receiving apparatus and a receiving method that provide a compensate with regard to CCI and ISI in SC-MIMO transmission. In the present exemplary embodiment, description is given of an equalizer according to the abovementioned first and second equalization technologies, and thereafter, description is given related to the equalizer using these equalizers.

Figure 2:
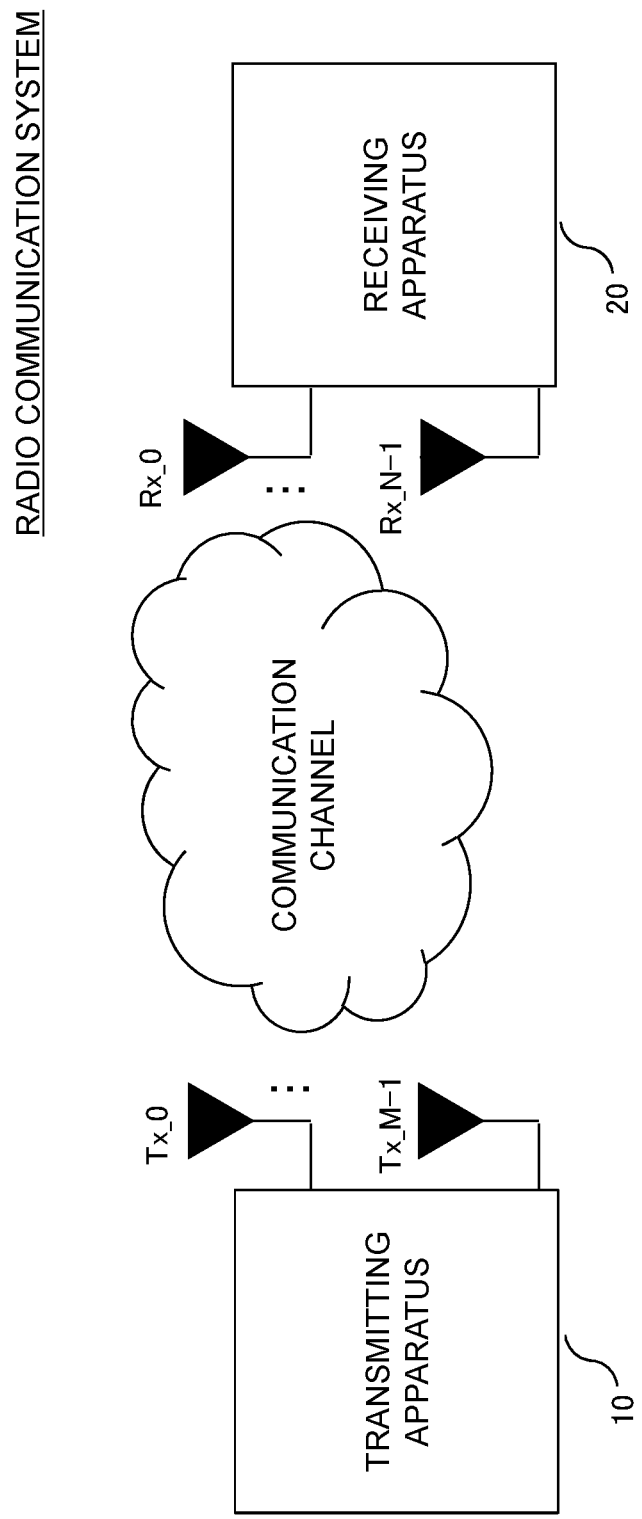
FIG. 2 is a diagram showing an outline configuration of a radio communication system according to a first exemplary embodiment.

FIG. 2 is a diagram showing an outline configuration of a radio communication system according to the first exemplary embodiment. Referring to FIG. 2, the radio communication system includes a transmitting apparatus 10 and a receiving apparatus 20.

As shown in FIG. 2, the transmitting apparatus 10 is provided with M transmitting antennas Tx_0 to Tx_M−1 (M is an integer greater than or equal to 2). The receiving apparatus 20 is provided with N receiving antennas Rx_0 to Rx_N−1 (N is an integer greater than or equal to 2).

The M transmitting antennas Tx transmit single carrier transmission signals at the same frequency band and time. Each of the N receiving antennas Rx receives a signal(s) transmitted by the transmitting antennas Tx.

Figure 3:
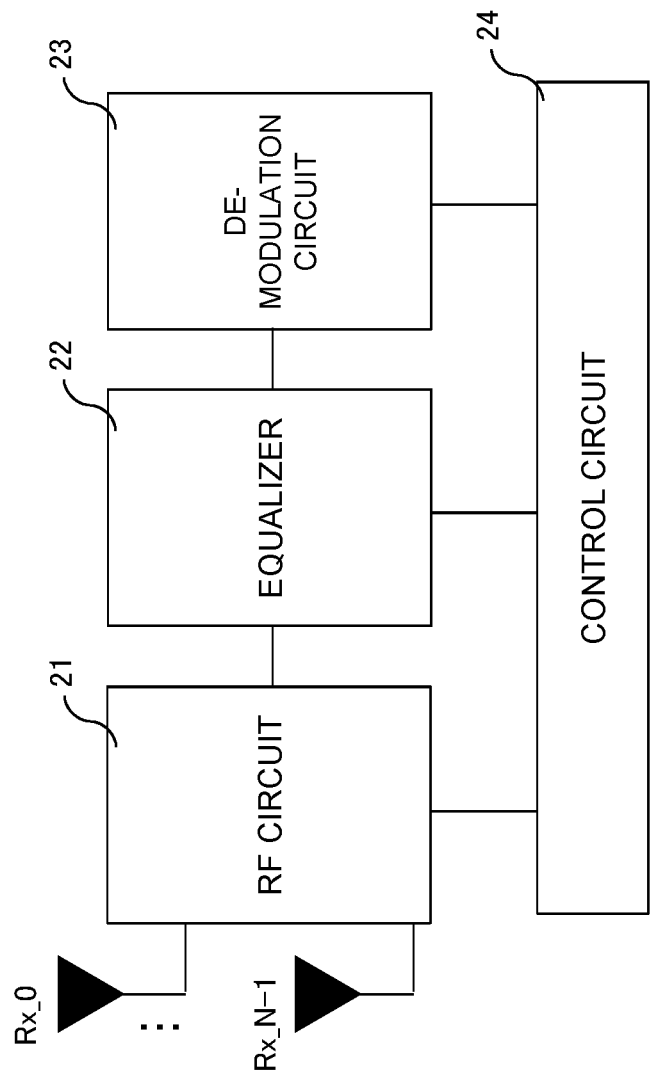
FIG. 3 is a diagram showing an example of an internal configuration of a receiving apparatus according to the first exemplary embodiment.

FIG. 3 is a diagram showing an example of an internal configuration of the receiving apparatus 20. Referring to FIG. 3 the receiving apparatus 20 is configured to include an RF (Radio Frequency) circuit 21, an equalizer 22, a demodulation circuit 23, and a control circuit 24.

The RF circuit 21 is connected to the receiving antennas Rx_0 to Rx_N−1, and receives the signals from the transmitting apparatus 10. The RF circuit 21 converts radio signals to baseband signals, and outputs the signals after this conversion to the equalizer 22.

The equalizer 22 is an adaptive equalizer of the receiving apparatus 20 where multi-input multi-output is possible in single carrier transmission. The equalizer 22 is a circuit that applies a frequency filter or the like so that frequency characteristic of reception signal is optimized. The signal to which the frequency filter is applied is outputted to the demodulation circuit 23. The equalizer 22 is connected to the receiving antennas Rx via the RF circuit 21, and receives as the input L signal(s) (L is an integer greater than or equal to 1) sampled in a sampling period T from each of the N receiving antennas Rx.

The demodulation circuit 23 demodulates the signal obtained from the equalizer 22 and generates a reception signal (reception data).

The control circuit 24 is implemented in a CPU (Central Processing Unit) or the like, and is a circuit that performs overall control of the receiving apparatus 20.

It is to be noted that as described above, in the present exemplary embodiment, the sampling period of the reception signal is denoted as T. The number of sampled signals inputted to the equalizer 22 is L. In the following description, for simplification N is taken to be 2 and L to be 3. Clearly it is not intended to limit the number (N) of receiving antennas to 2 or the number (L) of sampled signals to 3.

<Equalizer According to First Equalization Technology>

Next, an outline of an equalizer according, to the first equalization technology is described.

Figure 4:
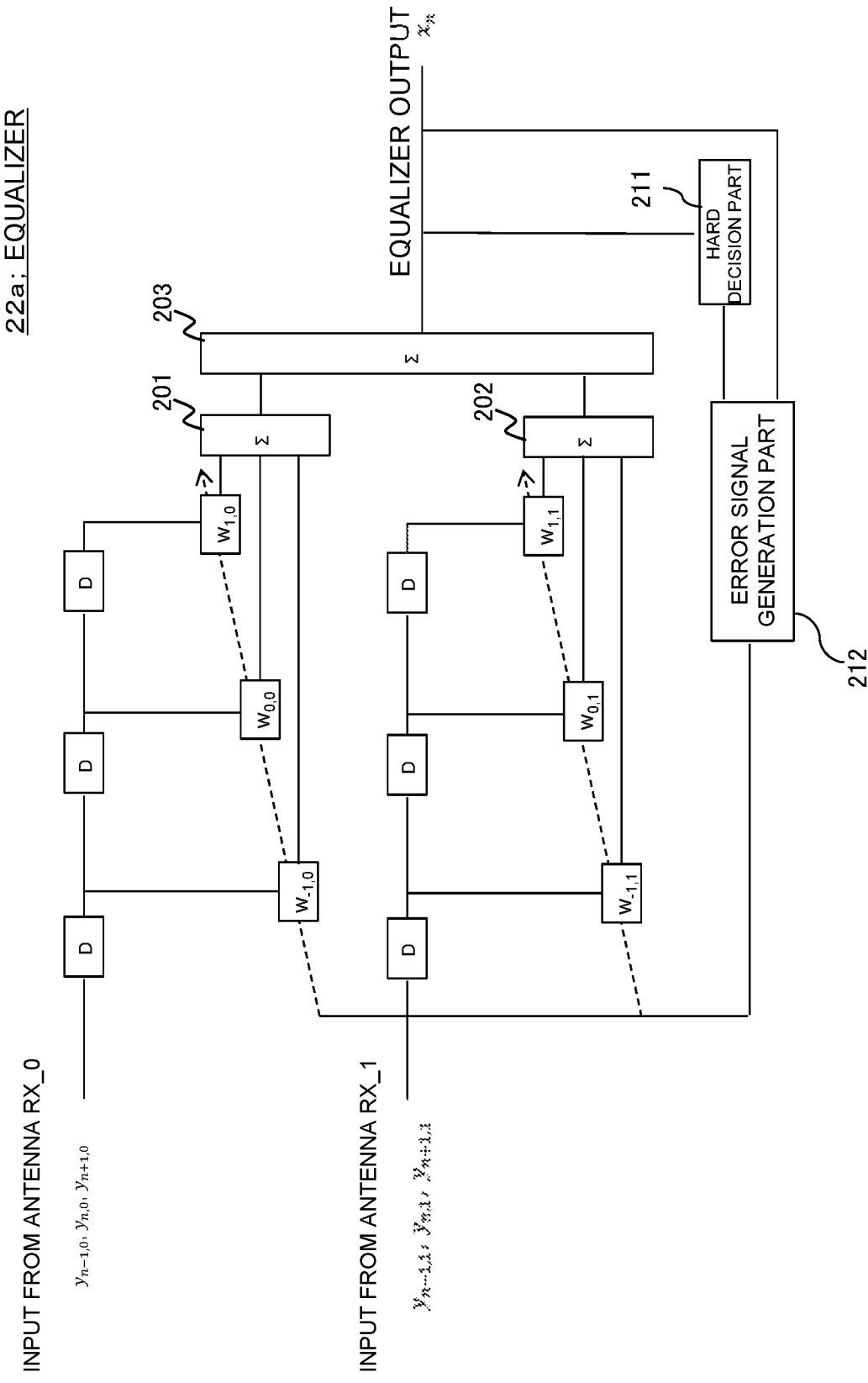
FIG. 4 is a block diagram showing an example of an internal configuration of an equalizer according to a first equalization technology.

FIG. 4 is a block diagram showing an example of an internal configuration of an equalizer 22a according to the first equalization technology. Here a description is given of calculation of an estimated signal for a transmission signal according to the first equalization technology, while referring to FIG. 4.

The n-th output $x_n$ of the equalizer 22a shown in FIG. 4 is calculated as below. First, as shown in formula (1) below, multiplication of 3 signals (L=3) inputted from 2 (N=2) receiving antennas Rx_0, Rx_1, and tap coefficients ($w_{i,j}$) corresponding thereto, is performed. Thereafter, the multiplication results are added together by adders (Σ) 201 to 203, and the transmission signal is estimated. It is to be noted that suffix i in the tap coefficients ($w_{i,j}$) corresponds to 3 signals inputted from respective antennas, and in the example of FIG. 4, corresponds to −1, 0, 1. Suffix j in the tap coefficients ($w_{i,j}$) corresponds to the respective antennas, and in the example of FIG. 4, corresponds to 0 or 1.

$$x_n = \sum_{i=-1}^{1} \sum_{j=0}^{1} w_{i,j} y_{n+i,j} \quad \text{Formula (1)}$$

Next a description is given of updating the tap coefficients by the equalizer 22a.

Updating of the tap coefficients uses difference of estimated signal (output of the adder 203; output of the equalizer 22a) and a decision result (a hard decision value(s)) by the hard decision part 211. More specifically, a differential signal generation part 212 generates the abovementioned difference as an differential signal. Updating of the tap coefficients is performed based on the differential signal. In more detail, by applying an adaptive equalization algorithm to the differential signal, the tap coefficients updating is performed. It is to be noted that a function module that executes the adaptive equalization algorithm is implemented in correspondence with respective tap coefficients ($w_{i,j}$), and illustration is omitted in FIG. 4.

As the adaptive equalization algorithm, any of a Least Mean Square (LMS) algorithm, a Normalized LMS (NLMS) algorithm, a Recursive Least Square (RLS) algorithm, or the like is used.

<Equalizer According to Second Equalization Technology>

Next, an outline of an equalizer according to the second equalization technology is described.

Figure 5:
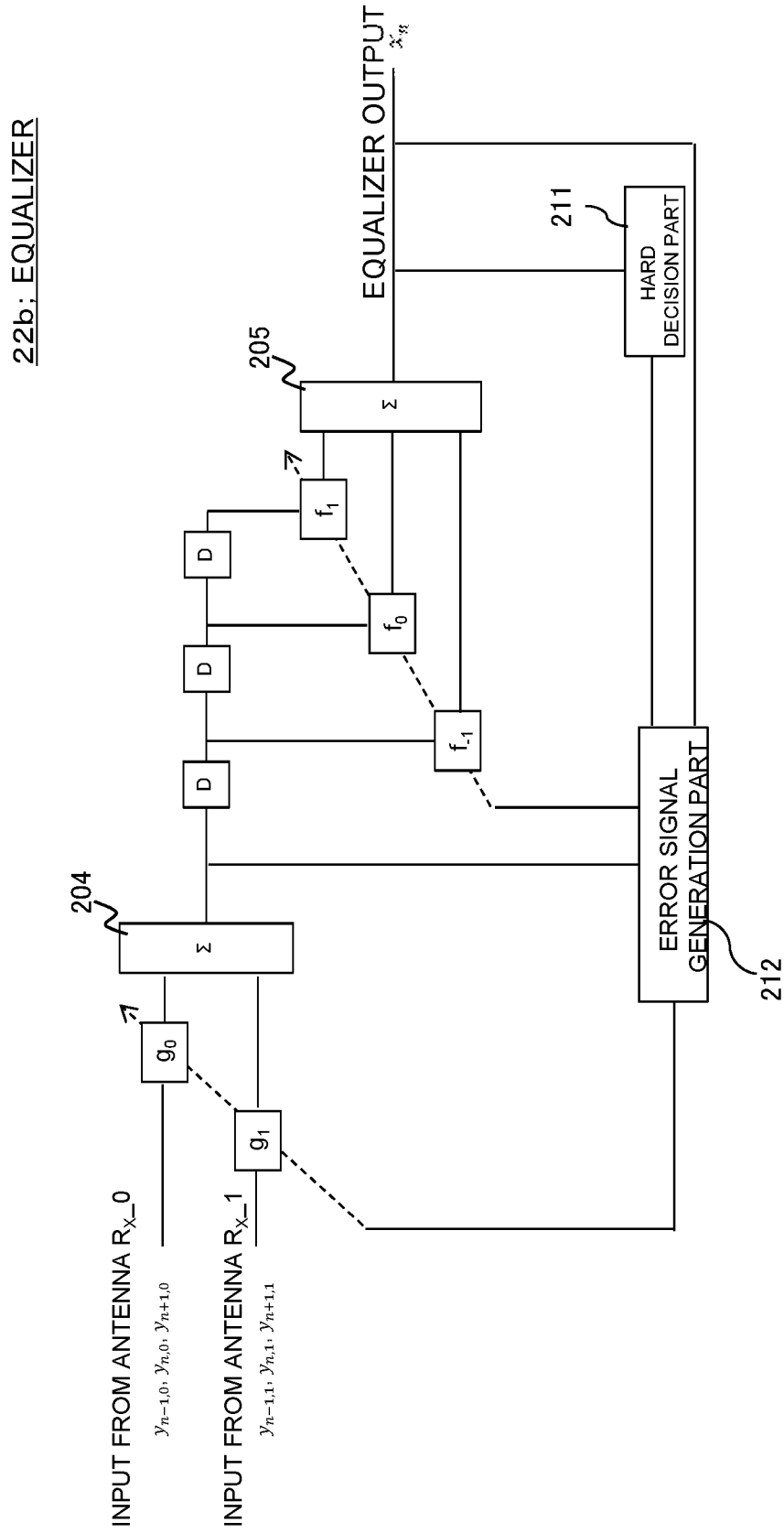
FIG. 5 is a block diagram showing an example of an internal configuration of an equalizer according to a second equalization technology.

FIG. 5 is a block diagram showing an example of an internal configuration of an equalizer 22b according to the second equalization technology. Here a description is given of calculation of an estimated signal with regard to a transmission signal according to the second equalization technology, while referring to FIG. 5.

In the equalizer 22b, as shown in formula (2) below, first, multiplication of signals inputted from receiving antennas Rx_0, Rx_1, and tap coefficients ($g_j$) corresponding respectively to each thereof, is performed, and a signal obtained by adding together the multiplication results is generated (first stage processing). Next, in the equalizer 22b, multiplication of 3 signals (L=3) added together in the first stage processing, and tap coefficients (fi) corresponding to each thereof, is performed, and a transmission signal is estimated by adding together the multiplication results.

$$x_n = \sum_{i=-1}^{1} f_i \sum_{j=0}^{1} g_j y_{n+i,j} \quad \text{Formula (2)}$$

It is to be noted that a transformation from formula (1) to formula (2) holds by assuming that the following formula (3) holds.

$$w_{i,j} = f_i g_j \quad \text{Formula (3)}$$

Next a description is given of updating the tap coefficients by the equalizer 22b.

In the equalizer 22b, the tap coefficients are updated by an adaptive equalization algorithm that uses the input signal to the tap coefficients and a differential signal.

Here, updating of tap coefficients (fi) in a later stage in the equalizer 22b is performed using a differential signal which is the difference between estimated signal (output of the equalizer 22b) and a hard decision value thereof, similar to the equalizer 22a.

Meanwhile, updating of the first stage tap coefficients ($g_j$) may be performed by using the same differential signal as in the later stage, or may be performed by generating a differential signal from signals added together in the first stage. In the disclosure of the present application, the tap coefficients ($g_j$) can be updated irrespective of the method of generating the differential signal. Therefore, in the following description there is no distinguishing, therebetween, and the first stage tap coefficients ($g_j$) are updated simply using the differential signal. It is to be noted that whichever of the updating methods is selected, there is no effect on implementation of the disclosure of the present application, and thus a detailed description is omitted.

<Equalizer Intermediate Between First and Second Equalization Technology>

Next, a description is given of positioning (significance) of the equalizer 22 according to the first exemplary embodiment, while assuming the existence of an equalizer according to the abovementioned first and second equalization technologies.

The equalizer 22 according to the first exemplary embodiment, corresponds to the equalizer intermediate between the first and second equalization technologies with regard to a tradeoff relationship in reception quality and implementation cost. More specifically, the equalizer 22 optimizes the configuration (configuration of adaptive equalizer) in accordance with the state of the communication channel. In order to make the significance of this equalizer 22 easier to understand, a description is given of a configuration of an equalizer intermediate between the first and the second equalization technologies.

The equalizer that is intermediate between the first and the second equalization technologies may be considered as an equalizer where portions of the equalizers of the respective technologies are connected in parallel. More specifically, in the sampling period T, a portion of the first equalization technology has a configuration provided with N antennas and K time-directed tap coefficients (K is an integer greater than or equal to 1 and less than L). A portion of the second equalization technology has a configuration provided with N antennas and L-K time-directed tap coefficients. Here, if N=2, L=3 and K=1, then 3 intermediate equalizers $22c1$ to $22c3$ may be considered as shown in FIG. 6 to FIG. 8.

Figure 6:
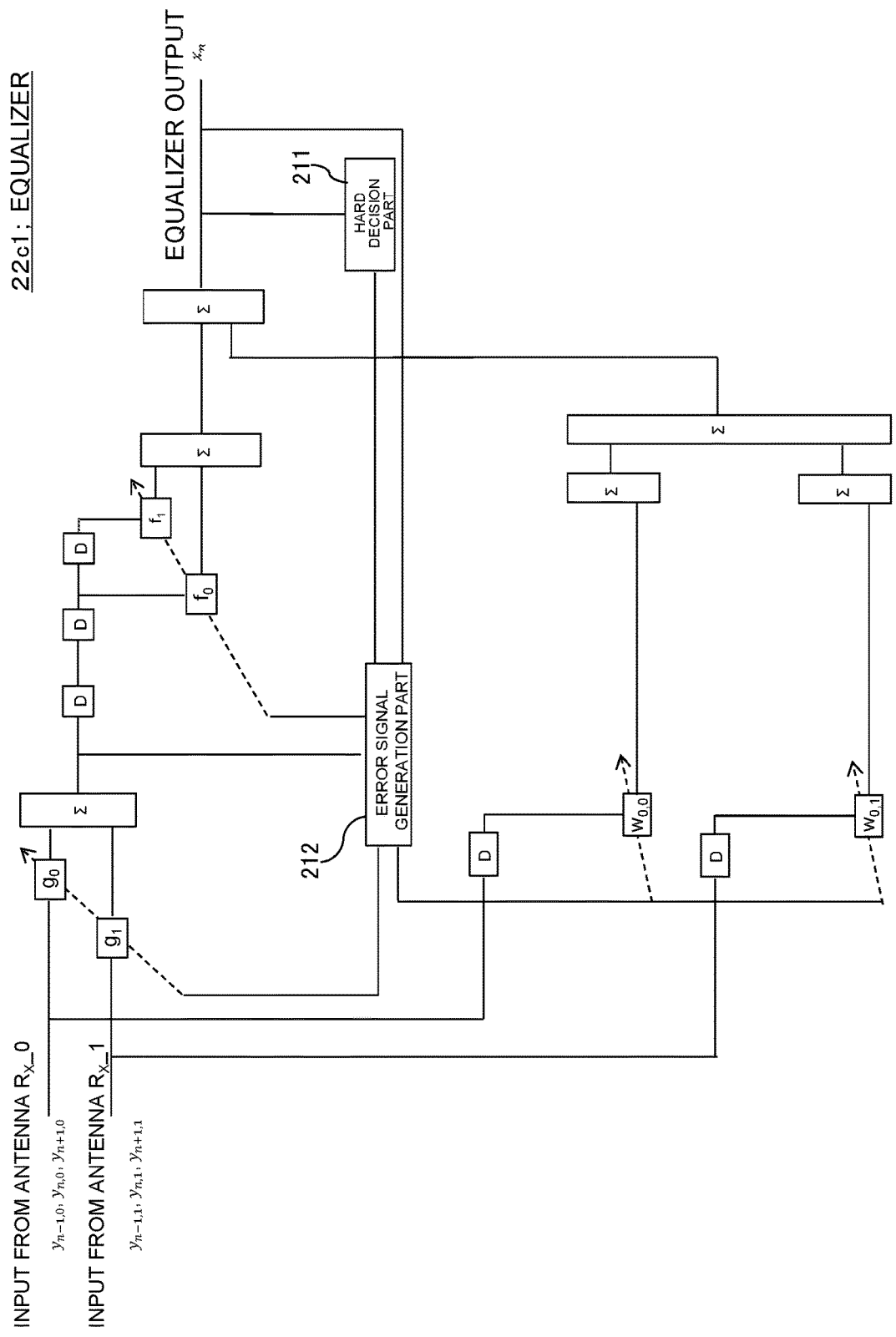
FIG. 6 is a block diagram showing an example of an internal configuration of an equalizer intermediate between the first and second equalization technologies.
Figure 7:
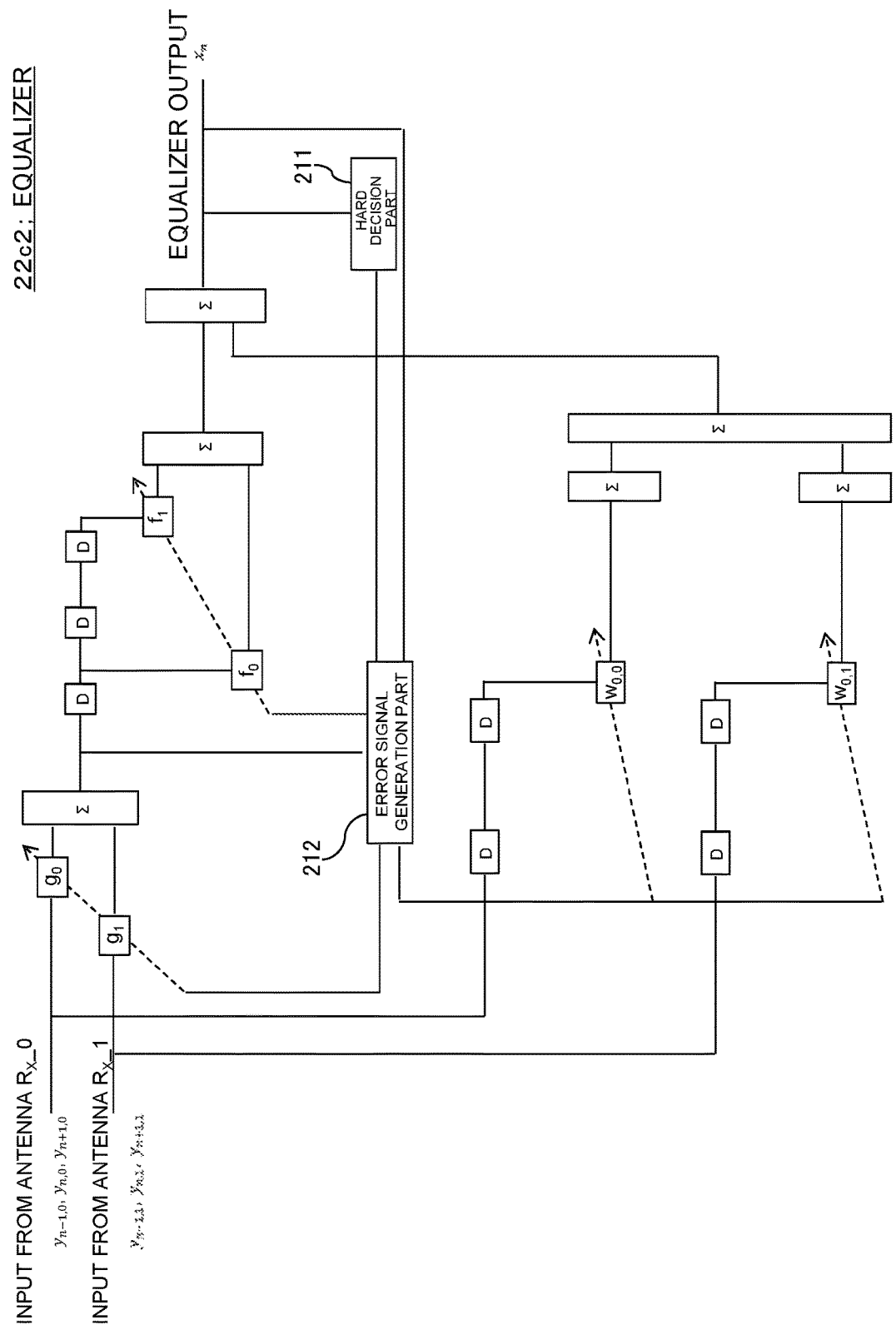
FIG. 7 is a block diagram showing an example of an internal configuration of an equalizer intermediate between the first and second equalization technologies.
Figure 8:
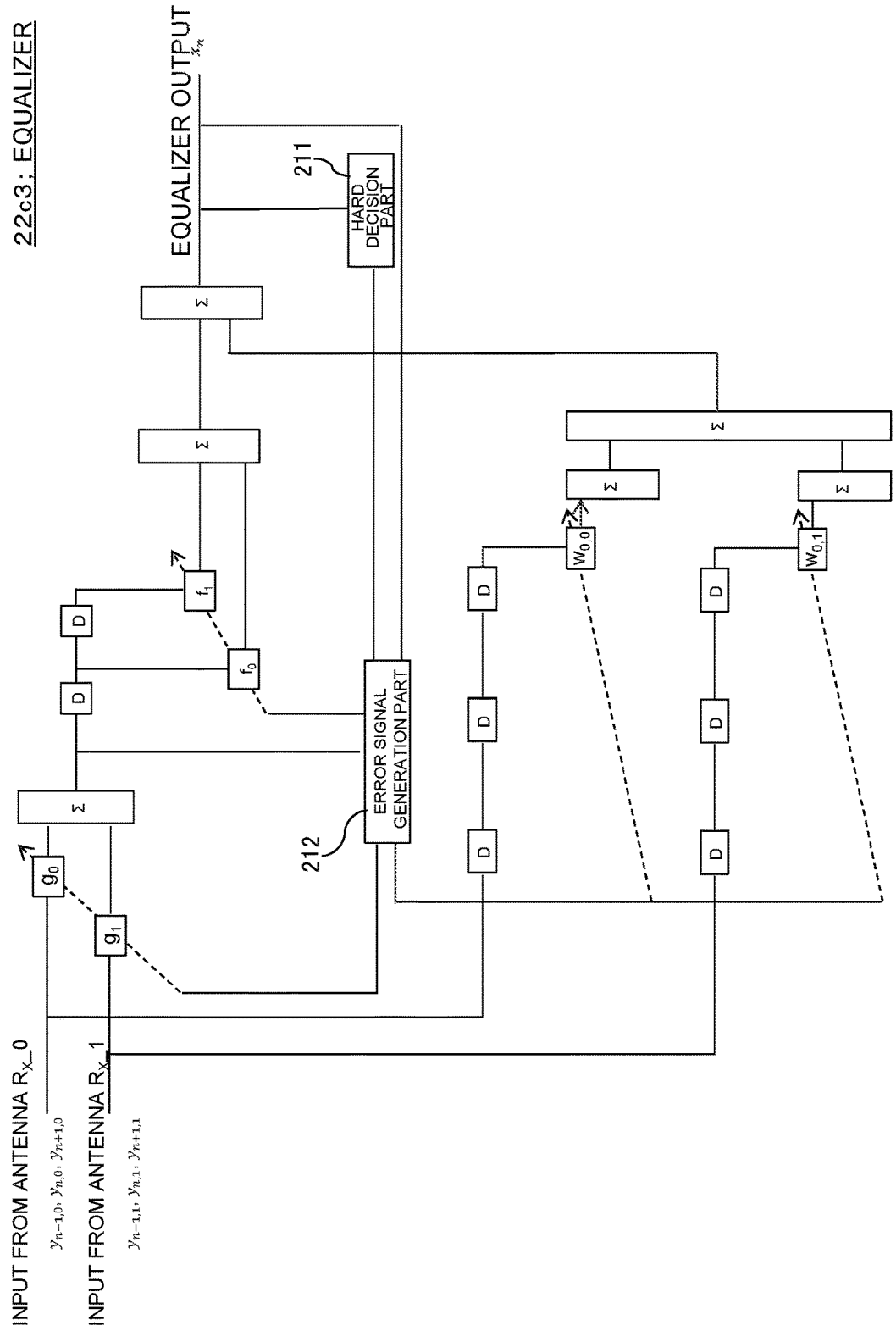
FIG. 8 is a block diagram showing an example of an internal configuration of an equalizer intermediate between the first and second equalization technologies.

In the respective drawings of FIG. 6 to FIG. 8, estimation of the transmission signal is indicated by the following formulas (4) to (6).

$$x_n = \sum_{j=0}^{1} w_{0,j} y_{n-1,j} + f_0 \sum_{j=0}^{1} g_j y_{n,j} + f_1 \sum_{j=0}^{1} g_j y_{n+1,j} \quad \text{Formula (4)}$$

$$x_n = f_0 \sum_{j=0}^{1} g_j y_{n-1,j} + \sum_{j=0}^{1} w_{0,j} y_{n,j} + f_1 \sum_{j=0}^{1} g_j y_{n+1,j} \quad \text{Formula (5)}$$

$$x_n = f_0 \sum_{j=0}^{1} g_j y_{n-1,j} + f_1 \sum_{j=0}^{1} g_j y_{n,j} + \sum_{j=0}^{1} w_{0,j} y_{n+1,j} \quad \text{Formula (6)}$$

Differences among the respective equalizers shown in FIG. 6 to FIG. 8 relate to range of application of assumption of independent compensation for the tap coefficients in the second equalization technology.

In a case of estimating the n-th transmission signal assuming the equalizer according to the second technology, in the equalizer $22c1$ shown in FIG. 6, the assumption of independent compensation given to the tap coefficient corresponding to the (n−1)-th reception signal ($y_{n-1,0}$, $y_{n-1,1}$), is relaxed.

In the equalizer $22c2$ shown in FIG. 7, the assumption of independent compensation given to the tap coefficients corresponding to the n-th reception signal ($y_{n,0}$, $y_{n,1}$), is relaxed.

In the equalizer $22c3$ shown in FIG. 8, the assumption of independent compensation given to the tap coefficients corresponding to the (n+1)-th reception signal ($y_{n+1,0}$, $y_{n+1,1}$), is relaxed.

Here, since the number of tap coefficients is the same, the implementation cost of the equalizers shown in the respective drawings of FIG. 6 to FIG. 8 is regarded as the same. However, reception quality of the respective equalizers depends on the state of the communication channels. Therefore, if the equalizer with any of the configurations of FIG. 6 to FIG. 8 is implemented, even if the implementation cost is the same, there may be a case where another configuration has superior reception quality.

From the abovementioned situation, the equalizer 22 according to the first exemplary embodiment has a configuration that can be switched to a configuration that maximizes the reception quality in accordance with the state of the communication channel.

<Equalizer According to a First Exemplary Embodiment>

Continuing, a description is given of a configuration of the equalizer 22 according to the first exemplary embodiment.

As described above, the equalizer 22 according to the first exemplary embodiment may be considered to be the equalizer where portions of the equalizers of the first and the second technologies are connected in parallel.

Figure 9:
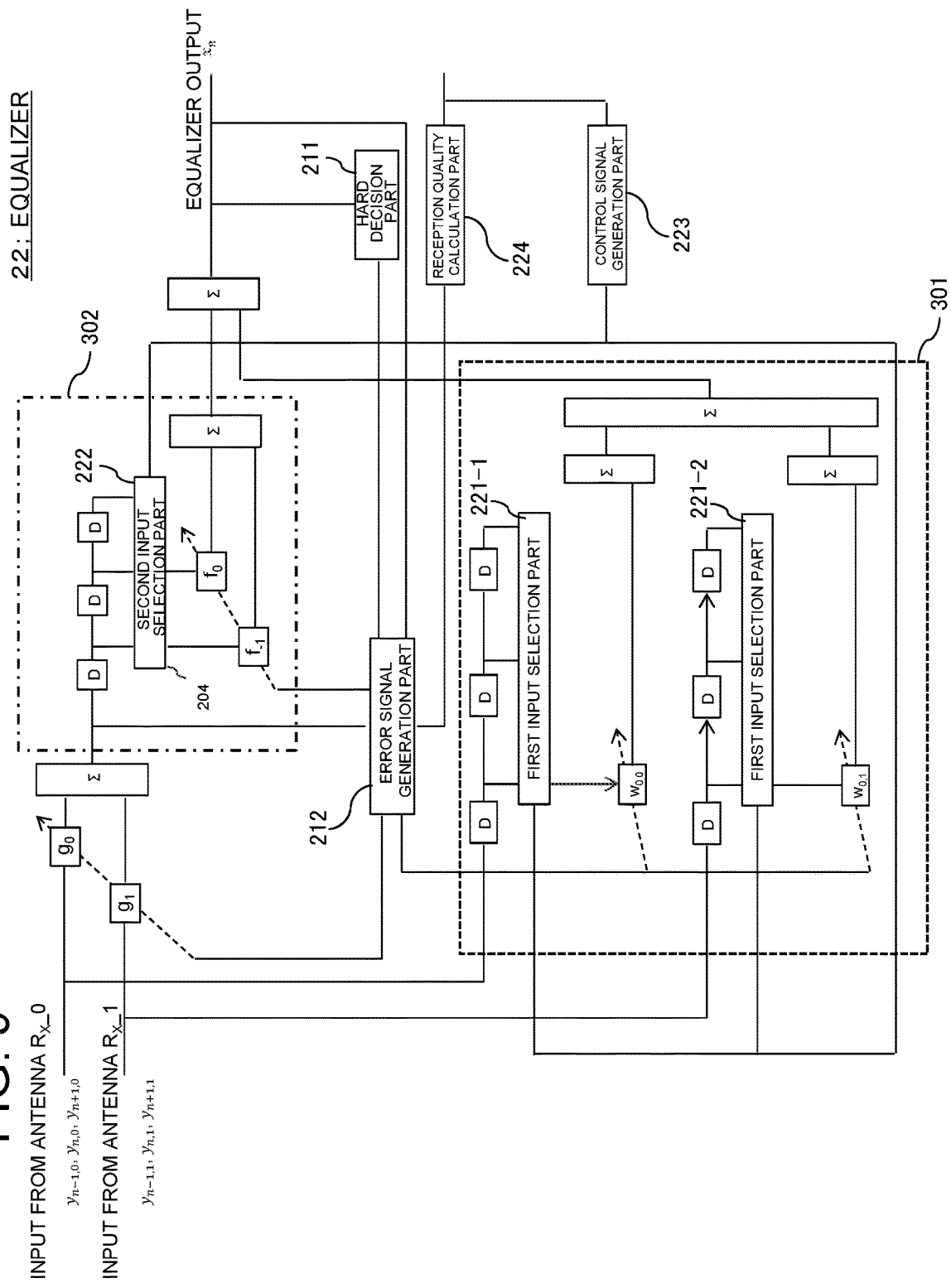
FIG. 9 is a block diagram showing an example of an internal configuration of an equalizer according to the first exemplary embodiment.

FIG. 9 is a block diagram showing an example of an internal configuration of the equalizer 22 according to the first exemplary embodiment.

The portion of the equalizer according to the first equalization technology has a configuration provided with N antennas and K time-directed tap coefficients. In the example of FIG. 9, an area 301 enclosed by a broken line is a portion of the equalizer according to the first equalization technology. In the area 301 the number of signal rows, which is the same as the number of antennas N, is 2, and the number of time-directed tap coefficients is 1 (K=1).

The portion of the equalizer according to the second equalization technology has a configuration provided with N antennas and L-K time-directed tap coefficients. In the example of FIG. 9, an area 302 enclosed by a dashed-dotted line is a portion of the equalizer according to the second equalization technology. In the area 302, the number of time-directed taps is 2 (L-K=3-1=2).

Continuing, FIG. 9 is described with a sampling period of T. In order to correspond to the equalizers $22c1$ to $22c3$ shown in FIG. 6 to FIG. 8, the configuration of the equalizer 22 in a case where N=2, L=3 and K=1, is shown in FIG. 9.

The equalizer 22 shown in FIG. 9 has a function to substantially switch configuration of multiple equalizers by switching assignment of signals to be inputted to the tap coefficients.

The equalizer 22 is provided with 3 modules in order to realize the function concerned in question (the switching of assignment of the signals to be inputted to the tap coefficients). Specifically, the equalizer 22 is provided with a first input selection part 221, a second input selection part 222, a control signal generation part 223, and a reception quality calculation part 224.

First a description is given of a configuration change by the first and second input selection parts.

A signal set inputted to the first input selection part 221 is a sampled signal set that is inputted from receiving antennas Rx_0, Rx_1, and is selection part 221 selects a signal set(s) to be multiplied by the tap coefficients ($w_{0,0}$, $w_{0,1}$) of the first equalization technology, from among the abovementioned signal sets, in accordance with the control signal. It is to be noted that, as described above, the first input selection part 221 is arranged in accordance with the signal set from the antenna. Since there are 2 signal sets in the example of FIG. 9, in the same diagram, the first input selection part 221-1 and the first input selection part 221-2 are illustrated. These two first input selection parts 221 may have the same configuration.

Thus, the first input selection part 221 selects K signals from the L signals for each of the N receiving antennas, as signals to be multiplied by the tap coefficients (w). It is to be noted that the selection of the signal by the first input selection part 221 is performed based on the control signal supplied by the control signal generation part 223.

A signal $z_n$ inputted to the second input selection part 222 corresponds to a signal after performing multiplication of the first stage tap coefficients of the second equalization technology and a sampled signal(s) which is(are) input from an antenna(s), and being expressed as in the formulas (7) to (9) described below.

$$z_{n-1} = \sum_{j=0}^{1} g_j y_{n-1,j} \qquad \text{Formula (7)}$$

$$z_n = \sum_{j=0}^{1} g_j y_{n,j} \qquad \text{Formula (8)}$$

$$z_{n+1} = \sum_{j=0}^{1} g_j y_{n+1,j} \qquad \text{Formula (9)}$$

The second input selection part 222 selects L-K signals to be multiplied by the tap coefficients (f), from the L signals obtained by multiplying signals in the same sampling period for each of the N receiving antennas by the tap coefficients, and performing addition thereof. Selection of the signal by the second input selection part 222 is performed based on a control signal supplied by the control signal generation part 223. In this way, the second input selection part 222 selects the signal to be multiplied by the tap coefficients (f) of the latter stage of the second equalization technology, from among the L signals, in accordance with the control signal from the control signal generation part 223.

Next, a description is given of the control signal supplied to the first and the second input selection parts.

The control signal generation part 223 generates the control signal to be supplied to each of the first input selection part 221 and the second input selection part 222. More specifically, the control signal generation part 223 generates an L bit signal as the control signal. In the example of FIG. 9, a 3 bit control signal is generated.

The first input selection part 221 and the second input selection part 222 each exclusively use the L bit control signal, and perform the signal selection. Here a specific description is given of a case of switching the configuration of the equalizer 22 to the configuration of the equalizer 22c1 shown in FIG. 6, by the abovementioned L bit control signal.

The first input selection part 221 interprets the 3 bit control signal, with input to the tap coefficients as "1", and non-input to the tap coefficients as "0". Meanwhile, the second input selection part 222 interprets the 3 bit control signal, with input to the tap coefficients as "0", and non-input as "1".

Therefore, in a case where the control signal is "100", the second input selection part 222 selects $z_n$ of formula (8) and $z_n$ of formula (9) as input to the tap coefficients (f). Meanwhile, the first input selection part 221 selects $\{y_{n-1,0}, y_{n-1,1}\}$ as input to the tap coefficients (w), according to the abovementioned 3 bit control signal.

In this way, the configuration of the equalizer 22 according to the first exemplary embodiment switches over to the configuration of the equalizer 22c1 shown in FIG. 6, according to the single control signal.

It is to be noted that according to the abovementioned description the control signals for switching the configuration of the equalizer 22 to the other equalizers 22c2 and 22c3, is clear, but these control signals may be consolidated as in FIG. 10.

In the above, a description was given of a case where the control signal generation part 223 supplies the same L bit control signals to the first input selection part 221 and the second input selection part 222. However, the control signal generation part 223 may supply different control signals to respective input selection parts. Specifically, the control signal generation part 223 generates a first control signal of L bits and supplies the first control signal to the first input selection part 221. Furthermore, the control signal generation part 223 generates a second control signal by bit-inversion of the first control signal and supplies the second control signal to the second input selection part 222. In this way, the control signal generation part 223 may generate 2 the control signals by bit inversion, and supply them to respective input selection parts. In this case, interpretation of the L bit control signals may be the same for the 2 input selection parts.

Next, a description is given concerning determination (selection) of control signal.

The control signal generation part 223 generates the control signal using a calculation result by the reception quality calculation part 224.

The reception quality calculation part 224 calculates an index indicating quality of the reception signal by the N receiving antennas Rx.

The control signal generation part 223 generates the control signal so as to optimize the quality of the reception signal obtained from the signal after selection by the first and the second input selection parts. The reception quality calculation part 224 calculates SINR (Signal to Interference plus Noise Ratio), for example, as the abovementioned index.

That is, the selection of control signal may be implemented by a function that measures reception quality by the reception quality calculation part 224. More specifically, the reception quality calculation part 224 measures SINR as the index that indicates the reception quality for respective equalizers switched by the control signal, at predetermined prescribed time intervals.

Here, in a case of using an adaptive equalizer, the reception quality calculation part 224 can calculate SINR equivalent to reception quality from the inverse of averaged differential signal, as in formula (10) below.

$$\text{SINR} = E\{x_n^2\}/E\{(x_n - s_n)^2\} \qquad \text{Formula (10)}$$

In formula (10), $x_n$ represents an estimation of a transmission signal estimated by the equalizer. In a case where the relevant transmission signal is a data signal, $s_n$ represents a hard decision signal with regard to $x_n$. In a case where the relevant transmission signal is a known signal, $s_n$ represents the known signal.

It may be said that the equalizer 22 may switch to the configuration of the equalizer in which reception quality, according to the configuration switched by the control signal, is measured by SINR calculated from the differential signal of equalizer output, with SINR ultimately being maximized. That is, the control signal generation part 223 may use the calculated SINR to select the control signal so as to finally select an equalizer for which reception quality is maximized.

The index when the reception quality is measured is not intended to be limited to the abovementioned SINR. That is, as a function for measuring the reception quality, an assumption was made of calculation of SINR using the differential signal of an adaptive equalizer, but clearly another index may also be used. For example, if combined with a function to measure the reception quality, such as bit error rate or frame error rate after processing to decode error correcting code, packet error rate obtained by comparing the symbol after error correction and the hard decision value (symbol) of the equalizer output, or the like, it is possible to switch over to the equalizer that maximizes the reception quality. That is, the control signal generation part 223 may select a control signal where the abovementioned error rate(s) is(are) minimized.

As described above, the equalizer 22 according to the first exemplary embodiment is provided with a configuration similar to the equalizer intermediate between the first and second equalization technologies, and by adding the signal multiplied by the tap coefficients (w) according to the first equalization technology, and the signal multiplied by the tap coefficients (f) according to the second equalization technology, a transmission signal(s) transmitted by M transmission antennas is(are) estimated in a time domain. That is, the equalizer 22 is partly provided with the equalizers according to the first and second equalization technologies, and by changing assignment of the signals inputted thereto by two selection parts, optimization in response to the state of the communication channel is realized.

According to the abovementioned description, the industrial applicability of the present invention is clear, and the present invention can be preferably applied to a communication system that performs SC-MIMO transmission provided with an adaptive equalizer in a time domain.

Some or all of the abovementioned exemplary embodiments may also be described as in the following, but there is no limitation to the following.

<Mode 1>
As in the equalizer according to the first aspect described above.

<Mode 2>
The equalizer according to the mode 1, further comprising: a control signal generation part that generates a control signal to be supplied to each of the first and the second selection parts, wherein the first selection part selects the signal to be multiplied by the first tap coefficients in response to the control signal, and the second selection part selects the signal to be multiplied by the second tap coefficients in response to the control signal.

<Mode 3>
The equalizer according to the mode 1 or 2, wherein the transmission signal that is transmitted by the M transmission antennas is estimated for time domain, by adding a signal multiplied by the first tap coefficients and the signal multiplied by the second tap coefficients.

<Mode 4>
The equalizer according to the mode 2, wherein the control signal generation part generates the control signal of L bits, and the first and second selection parts each exclusively use the L bit control signal and perform signal selection.

<Mode 5>
The equalizer according to the mode 4, wherein the control signal generation part supplies the L bit control signal to the first and second selection parts; in a case where the first selection part selects a signal obtained by multiplying 1 with respect to the L bit control signal by the first tap coefficients, the second selection part selects a signal obtained by multiplying 0 with respect to the L bit control signal by the second tap coefficients, and in a case where the first selection part selects a signal obtained by multiplying 0 with respect to the L bit control signal by the first tap coefficients, the second selection part selects a signal obtained by multiplying 1 with respect to the L bit control signal by the second tap coefficients.

<Mode 6>
The equalizer according to the mode 2, wherein the control signal generation part generates a first control signal of L bits and supplies the first control signal to the first selection part, and generates a second control signal obtained by bit-inverting the first control signal and supplies the second control signal to the second selection part.

<Mode 7>
The equalizer according to any one of the modes 2 to 6, further comprising: a reception quality calculation part that calculates an index indicating the quality of reception signal by the N receiving antennas, wherein the control signal generation part generates the control signal to optimize the quality of the reception signal obtained from a signal after selection by the first and second selection parts.

<Mode 8>
The equalizer according to the mode 7, wherein the reception quality calculation part calculates at least 1 among SINR (Signal to Interference plus Noise Ratio), bit error rate, packet error rate and frame error rate, as an index indicating the quality of the reception signal.

<Mode 9>
As in the receiving apparatus according to the second aspect described above.

<Mode 10>
As in the receiving method according to the third aspect described above.

<Mode 11>
A receiving apparatus for SC-MIMO transmission that receives a single carrier transmission signal(s) transmitted by M transmitting antennas (M is an integer greater than or equal to 2) by N receiving antennas (N is an integer greater than or equal to 2) in the same frequency band and time, and is provided with: an input switching apparatus A to which a signal sampled in a sampling period T is received as input from the N receiving antennas, and which generates a signal by multiplying the N signals by a tap coefficient(s) and performing addition thereof, and selects L-K signal(s) (K is an integer greater than or equal to 1) from these L signals (L is an integer greater than or equal to 1), by an L bit control signal generated by a switching signal generation apparatus, and an input switching apparatus B that selects K signal sets from these L signal sets, by the L bit control signal, with the N signals received as input by the respective antennas, the apparatus being provided with an adaptive equalizer in a time domain that estimates a transmission signal by multiplying signals selected by the input switching apparatus A and the input switching apparatus B by a tap coefficient and performing addition thereof.

<Mode 12>
The receiving apparatus according to the mode 11, provided with a time domain adaptive equalizer wherein: the L bit control signal generated by the switching signal generation apparatus is transmitted to the input switching apparatuses A and B; in the input switching apparatus A, with 1 or 0 in the L bit control signal regarded as input to a tap coefficient(s), and 0 or 1 regarded as non-input to the tap coefficient(s), L-K signals are selected as input to the tap coefficient(s) from L signals inputted to the input switching apparatus A; and in the input switching apparatus B, with 0 or 1 in the L bit control signal as input to the tap coefficients, and 1 or 0 as non-input to the tap coefficient(s), K signal sets are selected as input to the tap coefficient(s) from L signals to be inputted to the input switching apparatus B.

<Mode 13>
The receiving apparatus according to the mode 11, provided with a time domain adaptive equalizer, wherein the L bit control signal generated by a switching signal generation apparatus is transmitted to the input switching apparatus A, the signal obtained by bit-inversion of the L bit control signal is transmitted to the input switching apparatus B, in the input switching apparatuses A and B, with 0 or 1 in the L bit control signal regarded as input to the tap coefficients, and 1 or 0 as non-input to the tap coefficients, the L-K signals are selected as input to the tap coefficients from the L signals inputted to the input switching apparatus A, and K signal sets are selected as input to the tap coefficients from L signals inputted to the input switching apparatus B.

<Mode 14>

The receiving apparatus according to the mode 12 or 13, provided with a time domain adaptive equalizer, wherein by switching less than $2^L$ different L bit control signals in a prescribed time interval, a selected signal and a signal set are switched as input to the tap coefficients for the input switching apparatus A and the input switching apparatus B, with the adaptive equalizer configuration being determined wherein SINR is calculated from the reciprocal of the differential signal calculated by the adaptive equalizer in each time interval, and a control signal in which the SINR is maximized maximizes reception quality, and is used continuously used for a fixed time.

<Mode 15>

The receiving apparatus according to the mode 12 or 13, provided with a time domain adaptive equalizer, wherein by switching less than $2^L$ different control signals in a prescribed time interval, a selected signal and signal set are switched as input to the tap coefficients for the input switching apparatus A and the input switching apparatus B, and in each time interval, with a configuration of the adaptive equalizer being determined wherein bit error rate, packet error rate and frame error rate are calculated, and a control signal in which the error rate(s) is(are) minimized maximizes reception quality, the adaptive equalizer is used continuously used for a fixed time. It is to be noted that the mode 10 may be extended with regard to the modes 2 to 8, similar to the mode 1.

It is to be noted that the various disclosures of the cited non-patent literature described above are incorporated herein by reference thereto. Modifications and adjustments of exemplary embodiments and examples may be made within the bounds of the entire disclosure (including the scope of the claims) of the present invention, and also based on fundamental technological concepts thereof. Various combinations and selections (including partial removals) of various disclosed elements (including respective elements of the respective claims, respective elements of the respective exemplary embodiments and examples, respective elements of the respective drawings and the like) are possible within the scope of the disclosure of the present invention. That is, the present invention clearly includes every type of transformation and modification that a person skilled in the art can realize according to the entire disclosure including the scope of the claims and to technological concepts thereof. In particular, with regard to numerical ranges described in the present specification, arbitrary numerical values and small ranges included in the relevant ranges should be interpreted to be specifically described even where there is no particular description thereof.

REFERENCE SIGNS LIST 10 transmitting apparatus
20 receiving apparatus
21 RF circuit
22, 22a, 22b, 22c1 to 22c3, 100 equalizer
23 demodulation circuit
24 control circuit
101 first selection part
102 second selection part
201 to 205 adder
211 hard decision part
212 differential signal generation part
221, 221-1, 221-2 first input selection part
222 second input selection part
223 control signal generation part
224 reception quality calculation part
301, 302 area

The invention claimed is:

1. An equalizer that is connected with N receiving antennas, where N is an integer greater than or equal to 2, that receive single carrier transmission signals transmitted from M transmitting antennas, where M is an integer greater than or equal to 2, in the same frequency band at the same time, and that receive as input L signals, where L is an integer greater than 1, sampled according to a sampling period T from each of the N receiving antennas, the equalizer comprising:

a first selection part that selects at least one of K signals, where K is an integer greater than or equal to 1 and smaller than L, from the L signals, as signals to be multiplied by a first tap coefficients, for each of the N receiving antennas; and a second selection part that selects at least one of L-K signals to be multiplied by a second tap coefficients, from the L signals obtained by multiplying signals in the same sampling period for each of the N receiving antennas, by the second tap coefficients and performing addition thereof;

a control signal generation part that generates a control signal to be supplied to each of the first and the second selection parts; wherein the first selection part selects the least one of K signals to be multiplied by the first tap coefficients in response to the control signal, and the second selection part selects the at least one of L-K signals to be multiplied by the second tap coefficients in response to the control signal; wherein the control signal generation part generates a first control signal of L bits and supplies the first control signal to the first selection part, and generates a second control signal obtained by bit-inverting the first control signal of L bits and supplies the second control signal to the second selection part.

2. The equalizer according to claim 1, wherein a transmission signal that is transmitted by the M transmission antennas is estimated for a time domain, by adding a signal multiplied by the first tap coefficients and a signal multiplied by the second tap coefficients.

3. The equalizer according to claim 1, wherein a control signal generation part supplies the control signal of L bits to the first and the second selection parts;

in a case where the first selection part selects a signal obtained by multiplying 1 with respect to the L bits control signal by the first tap coefficients, the second selection part selects a signal obtained by multiplying 0 with respect to the L bit control signal by the second tap coefficients; and in a case where the first selection part selects a signal obtained by multiplying 0 with respect to the L bits control signal by the first tap coefficients, the second selection part selects a signal obtained by multiplying 1 with respect to the L bit control signal by the second tap coefficients.

4. The equalizer according to claim 1, further comprising:

a reception quality calculation part that calculates an index indicating a quality of reception signal by the N receiving antennas; wherein the control signal generation part generates the control signal to optimize the quality of the reception signal obtained from a signal after selection by the first and second selection parts.

5. The equalizer according to claim 4, wherein the reception quality calculation part calculates at least one among Signal to Interference plus Noise Ratio (SINR), bit error rate, packet error rate and frame error rate, as an index indicating the quality of the reception signal.

6. A receiving apparatus including the equalizer according to claim 1.

7. A receiving method in an equalizer that can connect with N receiving antennas N is an integer greater than or equal to 2 that receive single carrier transmission signals transmitted from M transmitting antennas, M is an integer greater than or equal to 2 in the same frequency band at the same time, and that receive as input L signal(s), L is an integer greater than 1, sampled according to a sampling period T from each of the N receiving antennas, the method comprising:
selecting at least one of K signals, K is an integer greater than or equal to 1 and smaller than L, from among the L signals, as signals to be multiplied by a first tap coefficients, for each of the N receiving antennas; and
selecting at least one of L-K signals to be multiplied by a second tap coefficients, from among the L signals obtained by multiplying signals in the same sampling period for each of the N receiving antennas, by the second tap coefficients and performing addition thereof; wherein
the at least one of K signals to be multiplied by the first tap coefficients is selected based on receiving a first control signal of L bits; and
the at least one of L-K signals to be multiplied by the second tap coefficients are selected based on receiving a second control signal obtained by bit-inverting the first control signal of L bits.

8. A receiving apparatus for Single Carrier-Multiple Input and Multiple Output (SC-MIMO) transmission configured to receive a single carrier transmission signals transmitted by M transmitting antennas, M is an integer greater than or equal to 2, by N receiving antennas, N is an integer greater than or equal to 2, in the same frequency band and time, the receiving apparatus comprising:
an input switching apparatus A configured to:
receive a signal sampled in a sampling period T as input from the N receiving antennas; and generate a signal by multiplying the N signals by a tap coefficients and perform addition thereof; and
further select at least one of L K signals, K is an integer greater than or equal to 1, from these L signals, L is an integer greater than 1, by an L bits control signal generated by a switching signal generation apparatus;
an input switching apparatus B configured to select at least one of K signals from the L signals, by the L bits control signal, with the N signals received as input by the respective N antennas; and
an adaptive equalizer in a time domain configured to estimate a transmission signal by multiplying signals selected by the input switching apparatus A and the input switching apparatus B by the tap coefficients, and perform addition thereof; wherein:
the L bits control signal generated by the switching signal generation apparatus is transmitted to the input switching apparatuses A and B;
in the input switching apparatus A, with 1 or 0 in the L bits control signal regarded as input to the tap coefficients, and 0 or 1 regarded as non-input to the tap coefficients, the at least one of L-K signals are selected as input to the tap coefficients from L signals inputted to the input switching apparatus A; and
in the input switching apparatus B, with 0 or 1 in the L bits control signal as input to the tap coefficients, and 1 or 0 as non-input to the tap coefficients, the at least one of K signals are selected as input to the tap coefficients from the L signals to be inputted to the input switching apparatus B.

9. The receiving apparatus according to claim 8, comprising:
a time domain adaptive equalizer, wherein the L bits control signal generated by a switching signal generation apparatus is transmitted to the input switching apparatus A, the signal obtained by bit-inversion of the L bits control signal is transmitted to the input switching apparatus B, wherein
in the input switching apparatuses A and B, with 0 or 1 in the L bits control signal regarded as input to the tap coefficients, and 1 or 0 as non-input to the tap coefficients,
the at least one of L-K signals being selected as input to the tap coefficients from the L signals inputted to the input switching apparatus A, and
the at least one of K signals being selected as input to the tap coefficients from the L signals inputted to the input switching apparatus B.

10. The receiving apparatus according to claim 8, comprising:
a time domain adaptive equalizer, wherein
by switching less than $2^L$ different L bits control signals in a prescribed time interval, a signal and a signal set which are selected as input to the tap coefficients are switched over in the input switching apparatus A and the input switching apparatus B, and wherein the time domain adaptive equalizer is configured to determine such that Signal to Interference plus Noise Ratio (SINR) is calculated from a reciprocal of the differential signal calculated by the time domain adaptive equalizer in each time interval, and a control signal in which the SINR is maximized maximizes reception quality, the time domain adaptive equalizer being used continuously for a fixed time for determination.

11. The receiving apparatus according to claim 8, comprising:
a time domain adaptive equalizer, wherein by switching less than $2^L$ different control signals in a prescribed time interval, a signal and signal set which are selected as input to the tap coefficients are switched over in the input switching apparatus A and the input switching apparatus B, and wherein
in each time interval, the time domain adaptive equalizer is configured to determine such that bit error rate, packet error rate and frame error rate are calculated, and a control signal in which the bit error rate is minimized maximizes reception quality, the time domain adaptive equalizer being used continuously used for a fixed time for determination.

* * * * *